(12) United States Patent
Dede et al.

(10) Patent No.: US 8,077,460 B1
(45) Date of Patent: Dec. 13, 2011

(54) HEAT EXCHANGER FLUID DISTRIBUTION MANIFOLDS AND POWER ELECTRONICS MODULES INCORPORATING THE SAME

(75) Inventors: Ercan Mehmet Dede, Ann Arbor, MI (US); Yan Liu, Canton, MI (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 0 days.

(21) Appl. No.: 12/839,039

(22) Filed: Jul. 19, 2010

(51) Int. Cl.
*H05K 7/20* (2006.01)

(52) U.S. Cl. .. 361/699; 361/715; 165/80.4; 165/104.33; 174/15.1

(58) Field of Classification Search ........................ None
See application file for complete search history.

(56) References Cited

U.S. PATENT DOCUMENTS

| | | | |
|---|---|---|---|
| 4,322,737 A | 3/1982 | Sliwa, Jr. |
| 4,392,153 A | 7/1983 | Glascock, II et al. |
| 4,494,171 A | 1/1985 | Bland et al. |
| 4,733,293 A | 3/1988 | Gabuzda |
| 4,748,495 A | 5/1988 | Kucharek |
| 4,783,721 A | 11/1988 | Yamamoto et al. |
| 4,868,712 A | 9/1989 | Woodman |
| 4,920,574 A | 4/1990 | Yamamoto et al. |
| 5,016,138 A | 5/1991 | Woodman |
| 5,023,695 A | 6/1991 | Umezawa et al. |
| 5,079,619 A | 1/1992 | Davidson |
| 5,088,005 A | 2/1992 | Ciaccio |
| 5,119,175 A | 6/1992 | Long et al. |
| 5,145,001 A | 9/1992 | Valenzuela |
| 5,210,440 A | 5/1993 | Long |
| 5,228,502 A | 7/1993 | Chu et al. |
| 5,260,850 A | 11/1993 | Sherwood et al. |
| 5,269,372 A | 12/1993 | Chu et al. |
| 5,270,572 A | 12/1993 | Nakajima et al. |
| 5,394,299 A | 2/1995 | Chu et al. |
| 5,546,274 A | 8/1996 | Davidson |
| 5,912,800 A | 6/1999 | Sammakia et al. |
| 5,983,997 A | 11/1999 | Hou |
| 6,058,010 A | 5/2000 | Schmidt et al. |
| 6,167,948 B1 | 1/2001 | Thomas |
| 6,242,075 B1 | 6/2001 | Chao et al. |
| 6,305,463 B1 | 10/2001 | Salmonson |
| 6,333,853 B2 | 12/2001 | O'Leary et al. |
| 6,431,260 B1 | 8/2002 | Agonafer et al. |
| 6,501,654 B2 | 12/2002 | O'Connor et al. |
| 6,580,609 B2 | 6/2003 | Pautsch |
| 6,665,185 B1 | 12/2003 | Kulik et al. |
| 6,828,675 B2 | 12/2004 | Memory et al. |
| 6,903,931 B2 | 6/2005 | McCordic et al. |
| 6,942,018 B2 | 9/2005 | Goodson et al. |
| 6,952,346 B2 | 10/2005 | Tilton et al. |

(Continued)

*Primary Examiner* — Boris Chervinsky

(74) *Attorney, Agent, or Firm* — Dinsmore & Shohl LLP

(57) ABSTRACT

A heat exchanger fluid distribution manifold includes a manifold body defining a coolant fluid chamber, a single fluid inlet, and a plurality of fluid outlets. The single fluid inlet is configured to introduce a coolant fluid into the coolant fluid chamber. The plurality of fluid outlets are configured to remove the coolant fluid from the coolant fluid chamber. At least two of the plurality of fluid outlets are separated from the single fluid inlet by an unequal distance, and a coolant fluid flow rate at each fluid outlet is substantially uniform. The heat exchanger fluid distribution manifold may further include a plurality of serpentine walls along the coolant fluid chamber. Each serpentine wall comprises a spline feature located proximate to an individual fluid outlet. The spline features are optimized such that the coolant fluid flow rate is substantially uniform and a total pressure drop is less than about 2 kPa.

18 Claims, 6 Drawing Sheets

U.S. PATENT DOCUMENTS

| | | |
|---|---|---|
| 6,972,365 B2 | 12/2005 | Garner |
| 6,986,382 B2 | 1/2006 | Upadhya et al. |
| 6,988,535 B2 | 1/2006 | Upadhya et al. |
| 6,992,382 B2 | 1/2006 | Chrysler et al. |
| 6,994,151 B2 | 2/2006 | Zhou et al. |
| 7,017,654 B2 | 3/2006 | Kenny et al. |
| 7,058,101 B2 | 6/2006 | Treusch et al. |
| 7,071,408 B2 | 7/2006 | Garner |
| 7,104,312 B2 | 9/2006 | Goodson et al. |
| 7,119,284 B2 | 10/2006 | Bel et al. |
| 7,184,269 B2 | 2/2007 | Campbell et al. |
| 7,188,662 B2 | 3/2007 | Brewer et al. |
| 7,204,303 B2 | 4/2007 | Thomas et al. |
| 7,205,653 B2 | 4/2007 | Brandenburg et al. |
| 7,212,409 B1 | 5/2007 | Belady et al. |
| 7,250,674 B2 | 7/2007 | Inoue |
| 7,295,440 B2 | 11/2007 | Ganev et al. |
| 7,298,617 B2 | 11/2007 | Campbell et al. |
| 7,298,618 B2 | 11/2007 | Campbell et al. |
| 7,302,998 B2 | 12/2007 | Valenzuela |
| 7,327,570 B2 | 2/2008 | Belady |
| 7,336,493 B2 | 2/2008 | Berkenbush et al. |
| 7,355,277 B2 | 4/2008 | Myers et al. |
| 7,365,981 B2 | 4/2008 | Myers et al. |
| 7,385,817 B2 | 6/2008 | Campbell et al. |
| 7,393,226 B2 | 7/2008 | Clayton et al. |
| 7,397,662 B2 | 7/2008 | Oyamada |
| 7,400,504 B2 | 7/2008 | Campbell et al. |
| 7,414,844 B2 | 8/2008 | Wilson et al. |
| 7,429,792 B2 | 9/2008 | Lee et al. |
| 7,435,623 B2 | 10/2008 | Chrysler et al. |
| 7,450,378 B2 | 11/2008 | Nelson et al. |
| 7,486,514 B2 | 2/2009 | Campbell et al. |
| 7,495,916 B2 | 2/2009 | Shiao et al. |
| 7,551,439 B2 | 6/2009 | Peugh et al. |
| 7,599,184 B2 | 10/2009 | Upadhya et al. |
| 7,608,924 B2 | 10/2009 | Myers et al. |
| 7,679,911 B2 | 3/2010 | Rapp |
| 7,738,249 B2 | 6/2010 | Chan et al. |
| 7,795,726 B2 | 9/2010 | Myers et al. |
| 7,808,780 B2 | 10/2010 | Brunschwiler et al. |
| 7,830,664 B2 | 11/2010 | Campbell et al. |
| 7,839,642 B2 | 11/2010 | Martin |
| 2002/0053726 A1 | 5/2002 | Mikubo et al. |
| 2003/0196451 A1 | 10/2003 | Goldman et al. |
| 2005/0121180 A1 | 6/2005 | Marsala |
| 2005/0199372 A1 | 9/2005 | Frazer et al. |
| 2005/0225938 A1 | 10/2005 | Montgomery et al. |
| 2006/0002086 A1 | 1/2006 | Teneketges et al. |
| 2006/0291164 A1 | 12/2006 | Myers et al. |
| 2007/0034360 A1 | 2/2007 | Hall |
| 2007/0041160 A1 | 2/2007 | Kehret et al. |
| 2007/0074856 A1 | 4/2007 | Bhatti et al. |
| 2007/0114656 A1 | 5/2007 | Brandenburg et al. |
| 2007/0119565 A1 | 5/2007 | Brunschwiler et al. |
| 2007/0177352 A1 | 8/2007 | Monfarad et al. |
| 2007/0188991 A1 | 8/2007 | Wilson et al. |
| 2007/0230127 A1 | 10/2007 | Peugh et al. |
| 2007/0236883 A1 | 10/2007 | Ruiz |
| 2008/0093053 A1 | 4/2008 | Song et al. |
| 2008/0245506 A1 | 10/2008 | Campbell et al. |
| 2009/0032937 A1 | 2/2009 | Mann et al. |
| 2009/0090490 A1 | 4/2009 | Yoshida et al. |
| 2009/0108439 A1 | 4/2009 | Brandenburg et al. |
| 2009/0294106 A1 | 12/2009 | Flotta et al. |
| 2010/0000766 A1 | 1/2010 | Loiselet et al. |
| 2010/0038774 A1 | 2/2010 | Zhang et al. |
| 2010/0142150 A1 | 6/2010 | Campbell et al. |
| 2010/0242178 A1 | 9/2010 | Goetting |
| 2010/0246117 A1 | 9/2010 | Brunschwiler et al. |

HEAT EXCHANGER FLUID DISTRIBUTION MANIFOLDS AND POWER ELECTRONICS MODULES INCORPORATING THE SAME

TECHNICAL FIELD

The present specification generally relates to heat exchanger fluid distribution manifolds and, more specifically, to heat exchanger fluid distribution manifolds having optimized serpentine walls to provide substantially uniform coolant fluid flow.

BACKGROUND

Heat sinking devices may be coupled to a heat generating device such as a semiconductor device to remove heat and lower the maximum operating temperature of the heat generating device. Coolant fluid may be used to receive heat generated by the heat generating device by convective thermal transfer and remove such heat from the heat generating device. Typical heat exchangers for power electronics applications often require the distribution of the coolant fluid to multiple locations within a system in order to effectively manage thermal loads. However, there is often a difference in the fluid flow between outlets if these locations are not located at equivalent distances from the fluid inlet. Additionally, the pressure drop from the inlet to each outlet may vary as a function of relative distance. It may be desirable to minimize the pressure drop across the structure to minimize pumping requirements and associated support equipment for the heat exchanger.

Accordingly, a need exists for alternative heat exchanger fluid distribution manifolds for providing coolant fluid to a heat exchanger.

SUMMARY

In one embodiment, a heat exchanger fluid distribution manifold includes a manifold body defining a coolant fluid chamber, a single fluid inlet, and a plurality of fluid outlets. The single fluid inlet is configured to introduce a coolant fluid into the coolant fluid chamber of the manifold body. The plurality of fluid outlets are configured to remove the coolant fluid from the coolant fluid chamber. At least two of the plurality of fluid outlets are separated from the single fluid inlet by an unequal distance, and a coolant fluid flow rate at each fluid outlet is substantially uniform.

In another embodiment, a heat exchanger fluid distribution manifold includes a manifold body defining a coolant fluid chamber, a single fluid inlet, a plurality of fluid outlets, and a plurality of serpentine walls along the coolant fluid chamber. The single fluid inlet is configured for introducing a coolant fluid into the coolant fluid chamber of the manifold body. The plurality of fluid outlets are configured for removing the coolant fluid from the coolant fluid chamber. At least two of the plurality of fluid outlets are separated from the single fluid inlet by an unequal distance, and a coolant fluid flow rate at each fluid outlet is substantially uniform. Each serpentine wall comprises a spline feature located proximate an individual fluid outlet, the spline features being geometrically optimized such that the coolant fluid flow rate at each fluid outlet is substantially uniform and a total pressure drop within the manifold body is less than about 2 kPa.

In yet another embodiment, a power electronics module includes a heat exchanger fluid distribution manifold, a heat exchanger module, and a power electronics device. The heat exchanger fluid distribution manifold includes a manifold body defining a coolant fluid chamber, a single fluid inlet, and a plurality of fluid outlets. The single fluid inlet is configured for introducing a coolant fluid into the coolant fluid chamber of the manifold body. The plurality of fluid outlets are configured for removing the coolant fluid from the coolant fluid chamber. At least two of the plurality of fluid outlets are separated from the single fluid inlet by an unequal distance, and a coolant fluid flow rate at each fluid outlet is substantially uniform. The heat exchanger module includes a heat exchanging surface and an exchanger outlet. The heat exchanger module is fluidly coupled to at least one fluid outlet of the heat exchanger fluid distribution manifold. Coolant fluid flows from the single fluid inlet and into the heat exchanger module through the fluid outlet. The power electronics device is thermally coupled to the heat exchanger module at the heat exchanging surface.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Figure 1:
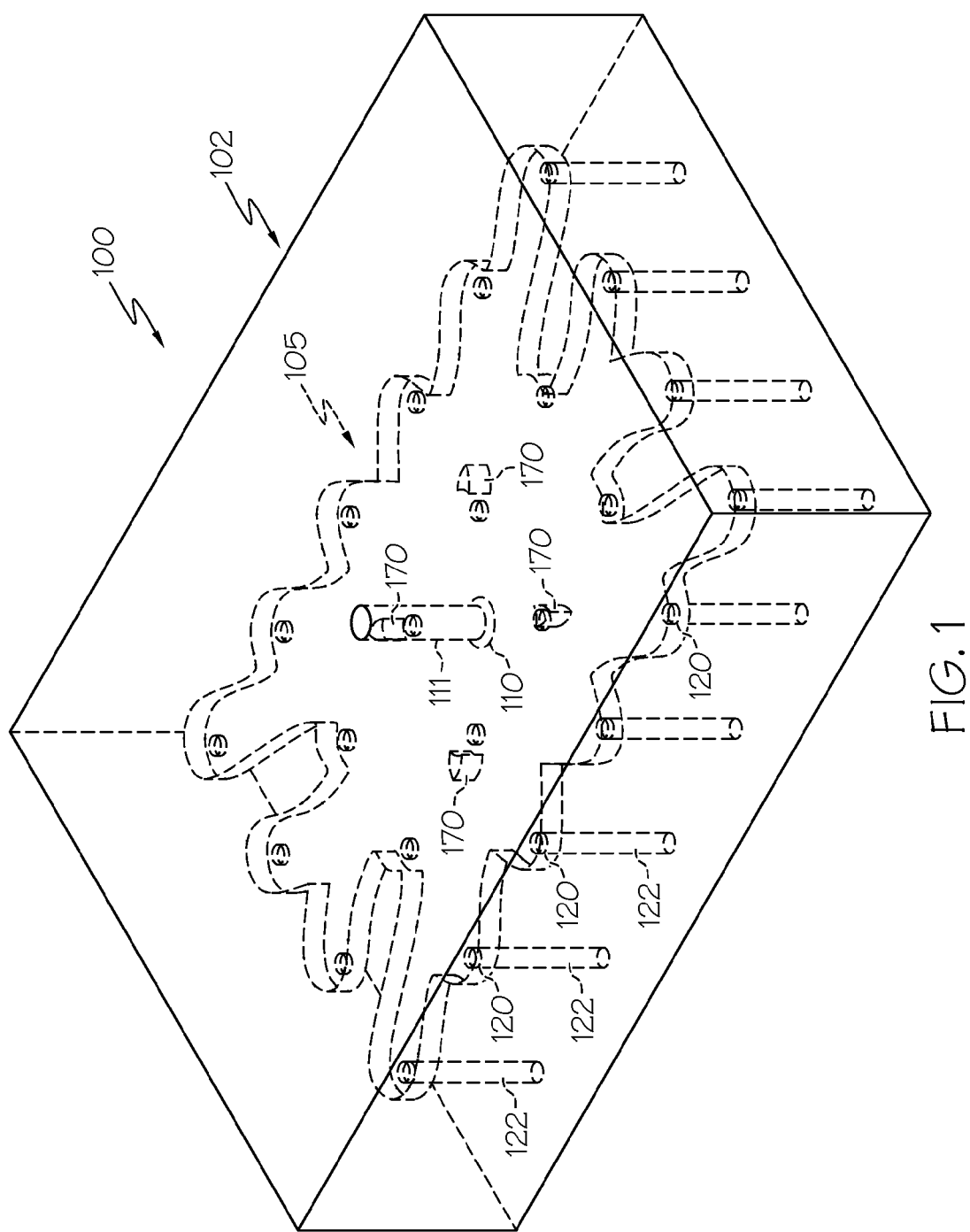
FIG. 1 depicts a perspective view of a heat exchanger fluid distribution manifold according to one or more embodiments shown and described herein.

FIG. 1 generally depicts one embodiment of a heat exchanger fluid distribution manifold. The heat exchanger fluid distribution manifold generally comprises a manifold body that defines a coolant fluid chamber, a single fluid inlet and a plurality of fluid outlets. Coolant fluid, such as water, ethylene glycol, refrigerants, etc., may enter the heat exchanger fluid distribution manifold at the single fluid inlet and travel through the coolant fluid chamber to the fluid outlets. The coolant may exit the heat exchanger fluid distribution manifold through the fluid outlets and be routed to a heat exchanger module that is thermally coupled to a heat generating device, such as a power electronics device. The coolant fluid chamber is configured such that the coolant fluid flow rate at each fluid outlet is substantially uniform and a total pressure drop within the coolant fluid chamber is minimized. In one embodiment, the manifold body has serpentine walls comprising spline features that are in close proximity to each fluid outlet. The shape of the serpentine walls and spline features are optimized such that velocity of direction of the cooling fluid flow is controlled to ensure that the coolant fluid flow rate at the fluid outlets is substantially uniform. Various embodiments of heat exchanger fluid distribution manifolds and power electronics modules will be described in more detail herein.

Referring now to FIG. 1, one embodiment of a heat exchanger fluid distribution manifold 100 is illustrated. The heat exchanger fluid distribution manifold 100 generally comprises a manifold body 102 having a coolant fluid chamber 105, a single fluid inlet channel 111 and a plurality of fluid outlet channels 122 disposed therein. The fluid inlet channel may be fluidly coupled to a fluid line 152 (see FIG. 4) that is connected to a coolant fluid source (not shown). In one embodiment, the coolant fluid source may be a radiator of a vehicle. As described in more detail below, coolant fluid may enter the heat exchanger fluid distribution manifold 100 via a fluid line and fluid inlet channel 111/fluid inlet 110 and exit the heat exchanger fluid distribution manifold 100 via the plurality of fluid outlets 120/fluid outlet channels 122. As illustrated in FIG. 1, a fluid inlet 110 at the coolant fluid chamber 105 is connected or otherwise associated with the fluid inlet channel 111. Similarly, each fluid outlet 120 is connected or otherwise associated with an individual fluid outlet channel 122.

The manifold body 102 may be made of a metal material, such as aluminum, for example. The manifold body 102 may also be made of a thermally insulating material, such as rigid plastic. In one embodiment, the manifold body 102 comprises a first half and a second half. The first and second halves may be machined or molded. When coupled together, the first and second halves define the internal features of the heat exchanger fluid distribution manifold 100, such as the coolant fluid chamber 105, the single fluid inlet channel 111, and the plurality of fluid outlet channels 122. The first and second halves may be coupled together by welding, adhesive or any other coupling methods. In another embodiment, the manifold body 102 is a single component that is molded to include the internal features and components described herein.

Figure 2:
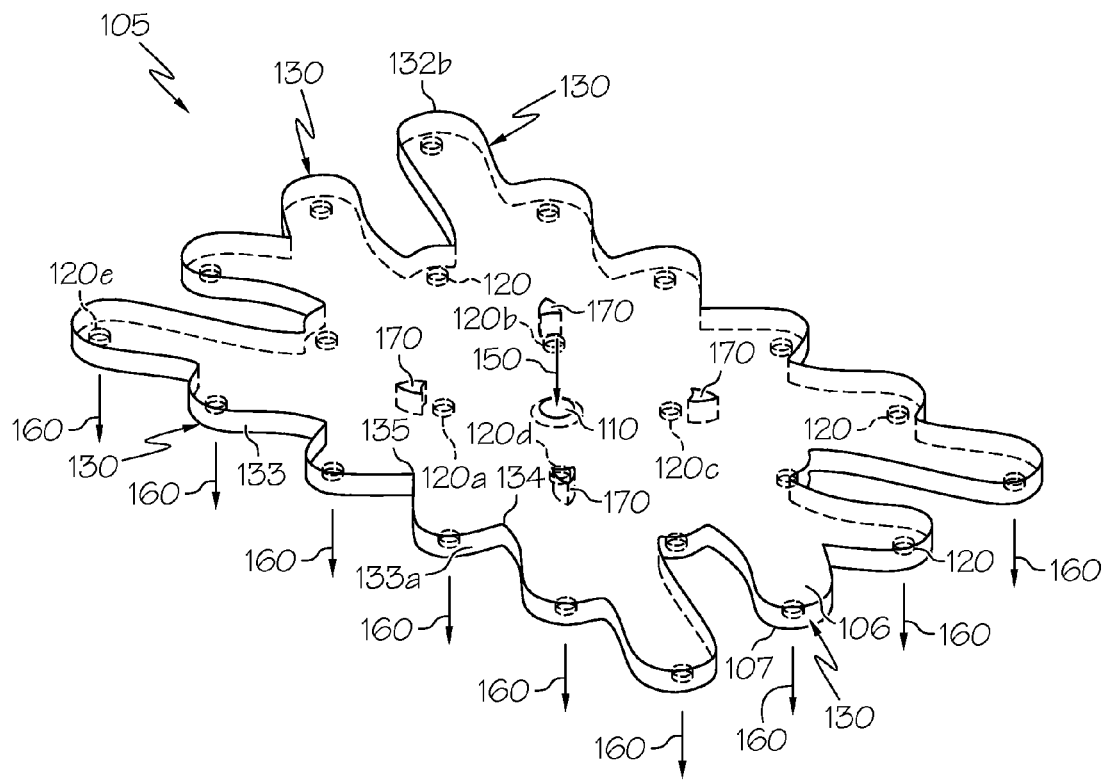
FIG. 2 depicts a perspective view of a coolant fluid chamber of the heat exchanger fluid distribution manifold illustrated in FIG. 1.

FIG. 2 illustrates the coolant fluid chamber 105 that is disposed in the heat exchanger fluid distribution manifold 100 that is illustrated in FIG. 1. The coolant fluid chamber 105 has a centrally-located, single fluid inlet 110 located on a first side 106 of the coolant fluid chamber 105. As described above, coolant fluid may enter the coolant fluid chamber 105 as depicted by arrow 150. The plurality of fluid outlets 120 are located about the single fluid inlet 110 in a grid pattern, with the single fluid inlet 110 located in the center of the grid pattern. Coolant fluid may flow out of the coolant fluid chamber through the fluid outlets as depicted by arrows 160. The fluid outlets 120 are located on a second side 107 of the coolant fluid chamber 105 that is opposite from the first side 106. Although the embodiment illustrated in FIGS. 1-3 have twenty-four fluid outlets 120, more or fewer fluid outlets may be utilized.

The distance between the fluid inlet and the fluid outlets varies from fluid outlet to fluid outlet. For example, the distance between an inner fluid outlet 120a and the fluid inlet 110 is greater than the distance between an outermost fluid outlet 120e and the fluid inlet 110. Because the distances between the fluid inlet and the various fluid outlets are not equal, a coolant fluid chamber having straight walls would cause uneven coolant flow rates at each fluid outlet 120, as well as a relatively larger total pressure drop. As used herein, the total pressure drop is the pressure drop within the coolant fluid chamber from the fluid inlet to the farthest fluid outlet. To minimize pumping requirements to circulate coolant fluid through the heat exchanger fluid distribution manifold, the total pressure drop should be as low as possible. Further, to achieve consistent and effective cooling for each heat exchanger coupled to the heat exchanger fluid distribution manifold, the coolant fluid flow rate for each fluid outlet should be substantially equal. In one embodiment, a maximum difference in coolant fluid flow rate between respective fluid outlets is less than $1.000 \times 10^{-3}$ kg/s.

Still referring to FIG. 2, the coolant fluid chamber 105 comprises a plurality of serpentine walls 130. The serpentine walls 130 are made up of a plurality of individual spline features 133 that are located close to the fluid outlets. A spline feature is defined by a curved wall portion that extends from one sharp angle or transition point to another sharp angle or transition point. For example, spline feature 133a illustrated in FIG. 2 is located between transition point 134 and transition point 135. The shape and size of the serpentine walls 130 and corresponding spline features 133 are optimized to reduce the total pressure drop within the coolant fluid chamber 105, as well as provide for a uniform coolant fluid flow rate at each fluid outlet 120. The term optimized, as used herein, means that the serpentine walls are geometrically designed to provide substantially uniform coolant fluid flow rate at each fluid outlet. The serpentine walls 130 are configured to guide the coolant fluid uniformly throughout the heat exchanger fluid distribution manifold 100.

Figure 3:
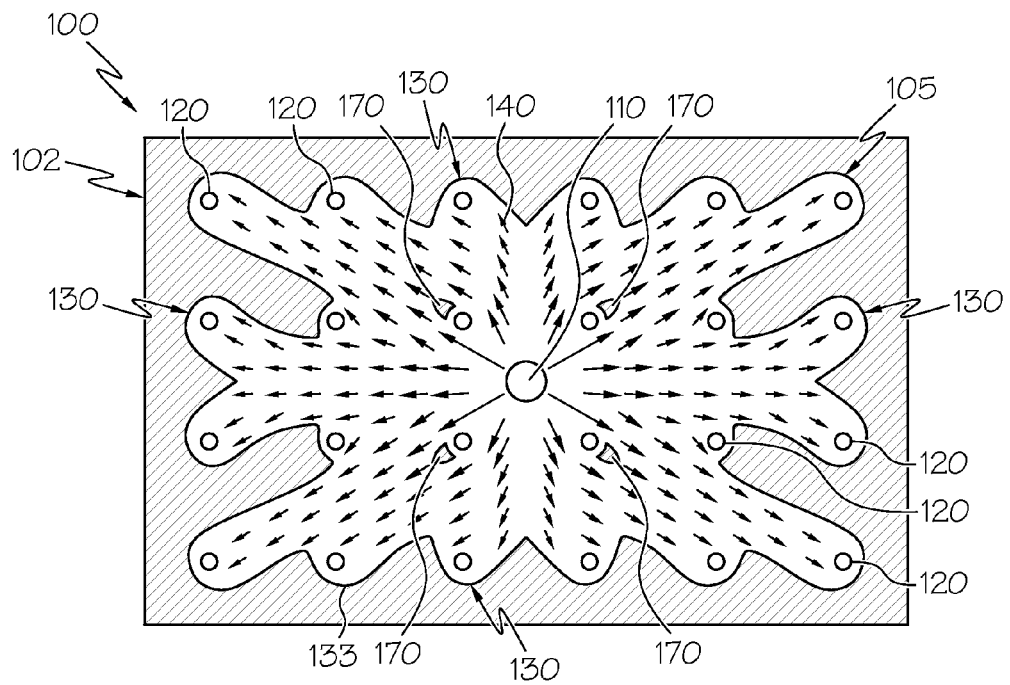
FIG. 3 depicts a cross section view of the heat exchanger fluid distribution manifold illustrated in FIG. 1.

The nature and shape of the spline features 133 is dictated by the expected flow velocity field within the coolant fluid chamber 105. FIG. 3 illustrates coolant fluid flow within the heat exchanger fluid distribution manifold 100. The arrows 140 indicate flow direction of the coolant fluid. In a manifold having straight walls, the velocity of the coolant fluid decreases with a rise in static pressure as the remaining fluid travels away from the fluid inlet. Therefore, the fluid flow rate increases moving linearly from a first outlet toward the last outlet furthest from fluid inlet. However, embodiments described herein utilize the serpentine walls 130 to optimize the area as well as the walls of the coolant fluid chamber 105 to obtain even coolant fluid flow distribution and minimize pressure loss. The serpentine walls 130 alter the velocity field of the coolant fluid flow.

Referring to FIGS. 2 and 3, interior routing features 170 may also be located within the coolant fluid chamber 105 to provide optimal routing of coolant fluid. The interior routing features 170 provide the same effect as the spline features 133 of the serpentine walls 130 for interior fluid outlets 120a-d that are not located near a serpentine wall. As illustrated in FIGS. 2 and 3, the interior routing features 170 are symmetrically located just past interior fluid outlets 120a-d along a radial direction as indicated by the coolant fluid flow arrows 140. The interior routing features 170 have a curved wall that faces the fluid outlet.

The serpentine walls 130 and interior routing features 170 are configured to maintain substantially equal coolant fluid velocity and pressure at fluid outlet despite the unequal distances between each fluid outlet and the fluid inlet. In such a manner, coolant fluid is evenly and efficiently distributed throughout the heat exchanger fluid distribution manifold 100. In one embodiment, the total pressure drop within the heat exchanger fluid distribution manifold 100 is less than 2 kPa. However, much lower total pressure drops may be achievable.

The geometric shape of the serpentine walls 130, spline features 133 and interior routing features 170 of the coolant fluid chamber may be determined by the use of an optimization procedure. In one embodiment, the optimization procedure begins with an optimized channel topology determined using a gradient-based optimizer coupled with a finite element analysis package. The term topology refers to the configuration of the serpentine walls, spline features and interior routing features. First, a generic design domain is optimized to minimize the fluid flow resistance given equivalent fluid outlet velocity boundary conditions. The resultant optimized topology is then utilized as an initial condition or suggestion for further fluid flow analysis. More specifically, the resultant topology is synthesized into a full distribution manifold structure model (e.g., a computer aided design module) that is used in subsequent fluid flow numerical simulations. Next, manual adjustment of the final shape of the features of the coolant fluid chamber may be performed to further interpret the topology optimization result and properly balance the overall flow rate distribution.

As an example and not a limitation, a computer simulation was performed on the geometry of the heat exchanger fluid distribution manifold illustrated in FIGS. 1-3. Total pressure drop and fluid flow velocity at each fluid outlet were determined. The simulated heat exchanger fluid distribution manifold had a coolant fluid chamber that was 120 mm in length, 80 mm in width, and 3 mm in depth. The single fluid inlet had a diameter of 6 mm and the fluid outlets had a diameter of 3 mm. The velocity of the coolant fluid introduced into the heat exchanger fluid distribution manifold at the fluid inlet was approximately 2.0 m/s. The velocity of the coolant fluid at each of the fluid outlets averaged 0.5 m/s with a maximum differential between fluid outlets of 0.05 m/s. The average mass flow rate at the fluid outlets was $2.6 \times 10^{-3}$ kg/s, with a maximum mass flow rate differential between fluid outlets of $0.5 \times 10^{-3}$ kg/s. The total pressure drop within the simulated heat exchanger fluid distribution manifold was about 2 kPa.

Figure 4:
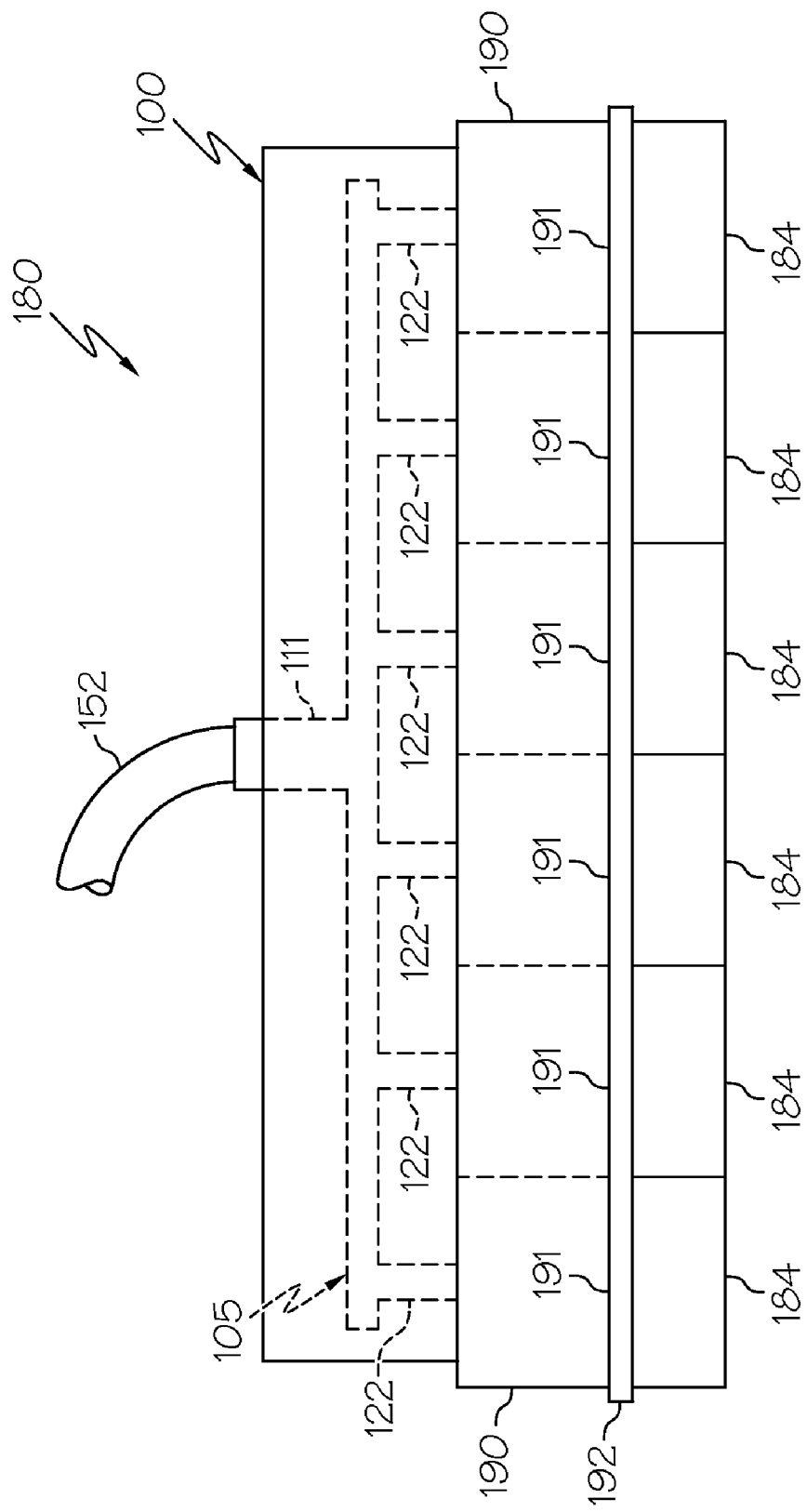
FIG. 4 depicts a side view of a power electronics module according to one or more embodiments shown and described herein.

Referring now to FIG. 4, a power electronics module 180 incorporating the heat exchanger fluid distribution manifold 100 described above and illustrated in FIGS. 1-3 is depicted. The power electronics module 180 comprises the heat exchanger fluid distribution manifold 100, a plurality of heat exchanger modules 190, a substrate layer 192 and a plurality of power electronic devices 184. In the illustrated embodiment, an individual heat exchanger module 190 is coupled to a single fluid outlet channel 122 of the heat exchanger fluid distribution manifold 100. Therefore, there are twenty-four heat exchanger modules 190 fluidly coupled to the heat exchanger fluid distribution manifold 100. In another embodiment, a single heat exchanger module may be fluidly coupled to two or more fluid outlet channels. In yet another embodiment, a single heat exchanger device or module may be coupled to all of the fluid outlets of the manifold.

A power electronics device 184, such as an IGBT, RC-IGBT, diode, MOSFET, etc., is thermally coupled to a heat exchanger module 190 at a heat exchanging surface 191. In another embodiment, more than one power electronics device may be thermally coupled to a heat exchanging module. Heat generated by the power electronics device 184 is transferred to the coolant fluid circulating within the heat exchanger module 190, thereby cooling the power electronics device 184. The heat exchanger modules 190 may be any type of heat exchanger that utilizes a coolant fluid to remove heat from a heat source. In one embodiment, an optional thermally conductive substrate layer 192 is located between the heat exchanger modules and the power electronics devices. The power electronics devices 184, heat exchanger modules 190, and the thermally conductive substrate layer 192 may be coupled together by solder, brazing or other thermal coupling methods.

The heat exchanger fluid distribution manifold 100 may be fluidly coupled to a coolant fluid source (not shown) via a fluid line 152 that is coupled to the fluid inlet channel 111. Coolant fluid enters the heat exchanger fluid distribution manifold 100 through the fluid line 152 and the fluid inlet channel 111 and exits the heat exchanger fluid distribution manifold 100 through the plurality of fluid outlets 120 and fluid outlet channels 122 as described above. The coolant fluid passes through the fluid outlet channels 122 and into the heat exchanger modules 190. Heat generated by the power electronics devices 184 is transferred to the coolant fluid circulating within the heat exchanger modules 190. The warmed coolant fluid within the heat exchanger modules 190 may exit through an outlet port (not shown) and returned to the coolant fluid source.

Figure 5:
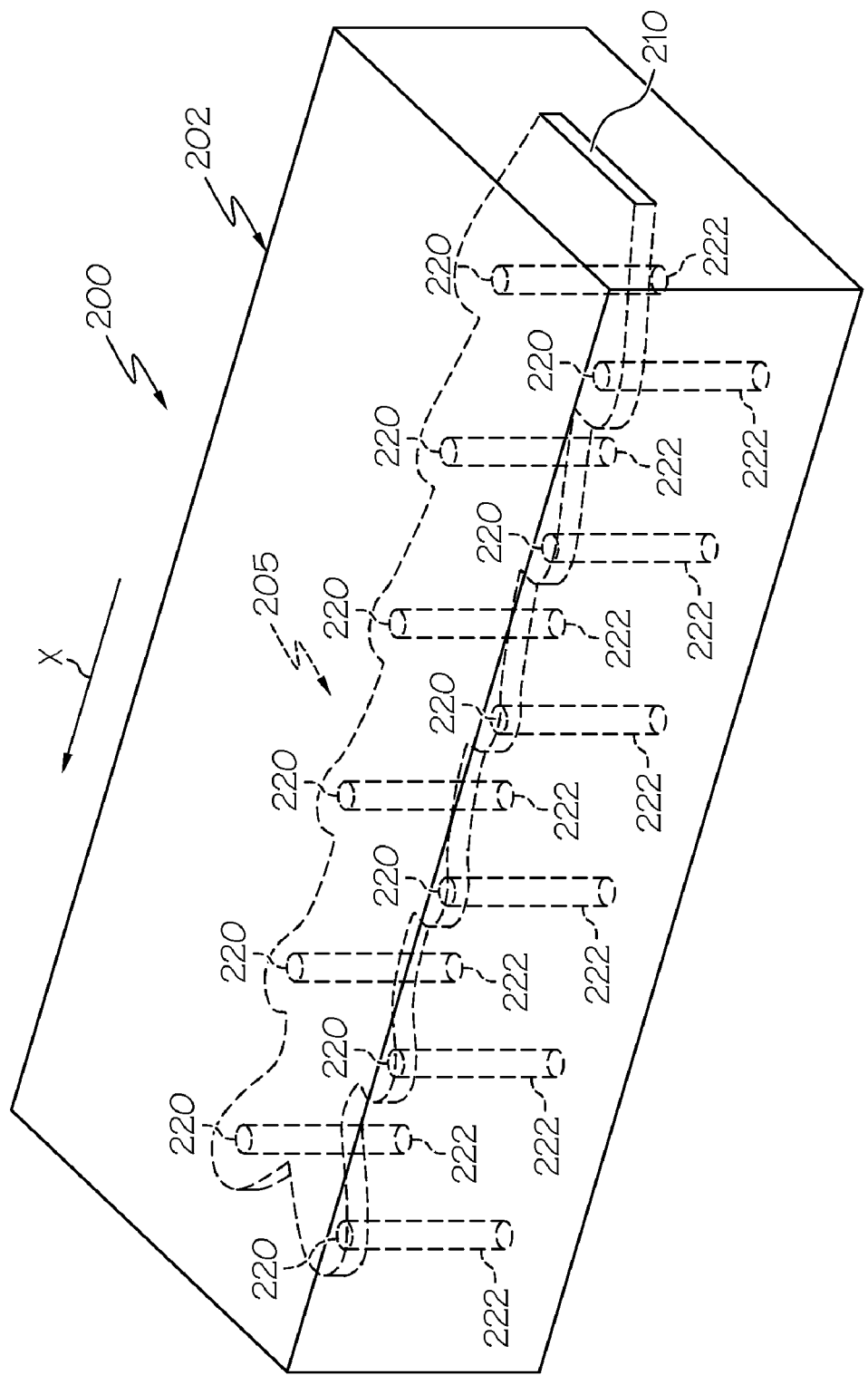
FIG. 5 depicts a perspective view of a heat exchanger fluid distribution manifold according to one or more embodiments shown and described herein.

Referring now to FIG. 5, another embodiment of a heat exchanger fluid distribution manifold 200 is illustrated. The embodiment comprises a single fluid inlet 210 at an edge of the heat exchanger fluid distribution manifold 200 and a plurality of fluid outlets 220 that are located along direction X with respect to the fluid inlet. The heat exchanger fluid distribution manifold 200 generally comprises a manifold body 202 having a coolant fluid chamber 205, and a plurality of fluid outlet channels 222 disposed therein. Each fluid outlet 220 is connected or otherwise associated with an individual fluid outlet channel 222. The fluid inlet 210 may be fluidly coupled to a fluid line 252 (see FIG. 8) that is connected to a coolant fluid source (not shown). Coolant fluid may enter the heat exchanger fluid distribution manifold 200 via a fluid line and fluid inlet 210 and exit the heat exchanger fluid distribution manifold 200 via the plurality of fluid outlets 220/fluid outlet channels 222.

As described above with respect to the embodiment illustrated in FIGS. 1-4, the manifold body 202 may be made of a metal material, such as aluminum, for example. The manifold body 202 may also be made of a thermally insulating material, such as rigid plastic. In one embodiment, the manifold body comprises a first half and a second half. In another embodiment, the manifold body 202 is a single component that is molded to include the internal features and components described herein.

Figure 6:
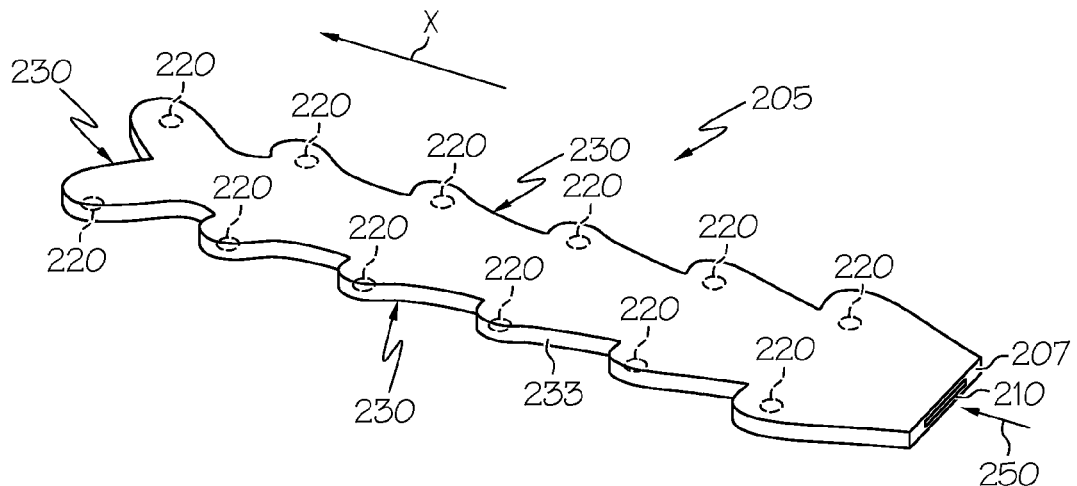
FIG. 6 depicts a perspective view of a coolant fluid chamber of the heat exchanger fluid distribution manifold illustrated in FIG. 5.

FIG. 6 illustrates the coolant fluid chamber 205 that is disposed in the heat exchanger fluid distribution manifold 200 that is illustrated in FIG. 5. The coolant fluid chamber 205 has a single fluid inlet 210 located on a first end 207. Coolant fluid may enter the coolant fluid chamber 205 as depicted by arrow 250. The plurality of fluid outlets 220 are located in two rows that extend from the first end 207 toward a second end that is opposite from the first end 207. In another embodiment, the plurality of fluid outlets may be arranged in a single row, or in more than two rows. Further, although the embodiment illustrated in FIGS. 5-7 have twelve fluid outlets 220, more or fewer fluid outlets 220 may be utilized.

The distance between the fluid inlet and the fluid outlets varies from fluid outlet to fluid outlet. For example, the distance between the fluid inlet 210 increases along the rows of plurality of fluid outlets 220 in direction X. Because the distances between the fluid inlet and the various fluid outlets are not equal, a coolant fluid chamber having straight walls would cause uneven coolant flow rates at each fluid outlet 220, as well as a relatively larger total pressure drop.

Figure 7:
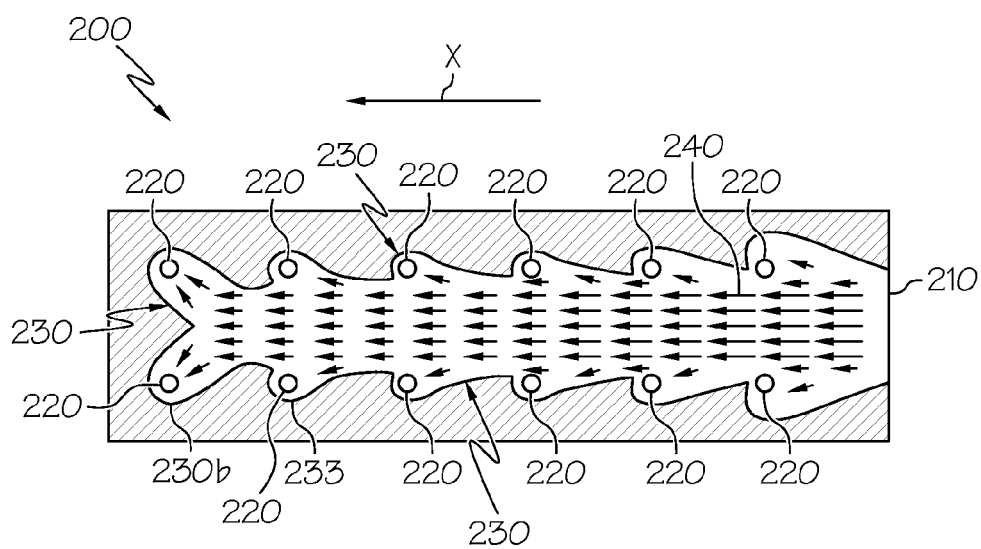
FIG. 7 depicts a cross section view of the heat exchanger fluid distribution manifold illustrated in FIG. 5.

Still referring to FIG. 6, the coolant fluid chamber 205 comprises a plurality of serpentine walls 230 that are similar in shape as the serpentine walls 130 described above. The geometric shape of the serpentine walls 230 and spline features 233 may be determined by the use of the optimization procedure described above. The serpentine walls 230 illustrated in FIGS. 5-7 are made up of a plurality of individual spline features 233 that are located proximate to the fluid outlets. The serpentine walls 230 and corresponding spline features 233 are optimized to reduce the total pressure drop within the coolant fluid chamber 205 as well as provide for a uniform coolant fluid flow rate at each fluid outlet 220. The serpentine walls 230 are configured to guide the coolant fluid uniformly throughout the heat exchanger fluid distribution manifold 200.

FIG. 7 illustrates coolant fluid flow within the heat exchanger fluid distribution manifold 200. The arrows 240 indicate flow direction of the coolant fluid. The embodiment illustrated in FIGS. 5-7 utilizes the serpentine walls 230 to optimize the area as well as the walls of the coolant fluid chamber 205 of the heat exchanger fluid distribution manifold 200 to obtain even coolant fluid flow distribution and minimize pressure loss.

The geometric shape of the serpentine walls 230 are designed to maintain substantially equal coolant fluid velocity and pressure at the fluid outlets despite the unequal distances between each fluid outlet and the fluid inlet. In such a manner, coolant fluid may be evenly and efficiently distributed throughout the heat exchanger fluid distribution manifold 200.

As an example and not a limitation, a computer simulation was performed on the geometry of the heat exchanger fluid distribution manifold illustrated in FIGS. 5-7 to determine total pressure drop and fluid flow velocity at each fluid outlet. The simulated heat exchanger fluid distribution manifold had a coolant fluid chamber that was 130 mm in length, 40 mm in width, and 3 mm in depth. The single fluid inlet had a length of 20 mm and the fluid outlets had a diameter of 3 mm. The velocity of the coolant fluid introduced into the heat exchanger fluid distribution manifold at the fluid inlet was 0.8 m/s. The velocity of the coolant fluid at each of the fluid outlets averaged about 0.79 m/s with a maximum differential between fluid outlets of about 0.05 m/s. The average mass flow rate at the fluid outlets was about $3.6 \times 10^{-3}$ kg/s, with a maximum mass flow rate differential between the fluid outlets closest to the fluid inlet and the fluid outlets further from the fluid inlet of about $0.5 \times 10^{-3}$ kg/s. The total pressure drop within the simulated heat exchanger fluid distribution manifold was 0.5 kPa.

Figure 8:
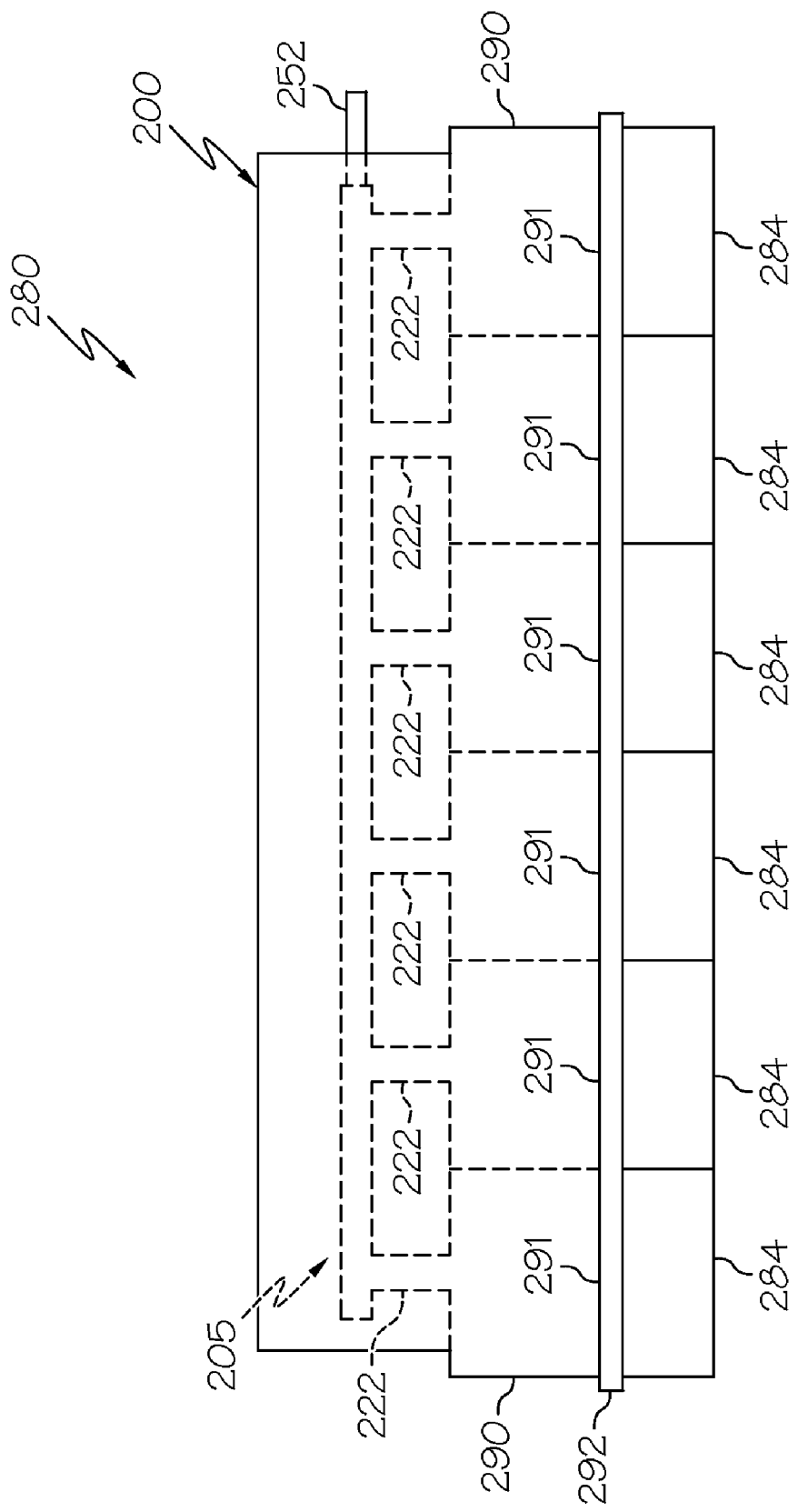
FIG. 8 depicts a side view of a power electronics module according to one or more embodiments shown and described herein.

Referring now to FIG. 8, a power electronics module 280 incorporating the heat exchanger fluid distribution manifold 200 described above and illustrated in FIGS. 1-3 is depicted. The power electronics module 280 comprises the heat exchanger fluid distribution manifold 200, a plurality of heat exchanger modules 290, an optional substrate layer 292, and a plurality of power electronic devices 284. In the illustrated embodiment, an individual heat exchanger module 290 is coupled to a single fluid outlet channel 222 of the heat exchanger fluid distribution manifold 200. Therefore, there are twelve heat exchanger modules 290 fluidly coupled to the heat exchanger fluid distribution manifold 200. In another embodiment, a single heat exchanger module may be fluidly coupled to two or more fluid outlet channels. In yet another embodiment, a single heat exchanger device or module may be coupled to all of the fluid outlets of the manifold.

As described above with reference to FIG. 4, a power electronics device 284 (e.g., an IGBT, RC-IGBT, diode, MOSFET, etc.) is thermally coupled to a heat exchanger module 290 at a heat exchanging surface 291. In another embodiment, more than one power electronics device may be thermally coupled to a heat exchanger module. The heat exchanger modules 290 may be any type of heat exchanger that utilizes a coolant fluid to remove heat from a heat source. In one embodiment, an optional thermally conductive substrate layer 292 is located between the heat exchanger modules and the power electronics devices. The power electronics devices 294, heat exchanger modules 290, and the thermally conductive substrate layer 292 may be coupled together by solder, brazing or other thermal coupling methods.

The heat exchanger fluid distribution manifold 200 may be fluidly coupled to a coolant fluid source (not shown) via a fluid line 252 that is coupled to the fluid inlet channel 211. Coolant fluid enters the heat exchanger fluid distribution manifold 200 through the fluid line 250 and the fluid inlet channel 211 and exits the heat exchanger fluid distribution manifold 200 through the plurality of fluid outlets 220 and fluid outlet channels 222 as described above. The coolant fluid passes through the fluid outlet channels 222 and into the heat exchanger modules 290. Heat generated by the power electronics devices 284 is transferred to the coolant fluid circulating within the heat exchanger modules 290. The warmed coolant fluid within the heat exchanger modules 290 may exit through an outlet port (not shown) and returned to the coolant fluid source.

It should now be understood that the heat exchanger fluid distribution manifolds described herein have coolant fluid chambers with serpentine walls that are designed to optimize coolant fluid flow such that the coolant fluid flow rate at each of the fluid outlets is substantially uniform. The serpentine walls also minimize a total pressure drop within the heat exchanger fluid distribution manifold. Reduced total pressure drop minimizes the pumping requirement needed to provide coolant fluid through the manifold, and a substantially uniform coolant rate ensures that each heat exchanger coupled to the manifold receives an equal amount of coolant fluid at an equal rate. The heat exchanger fluid distribution manifolds described herein may be incorporated into power electronics modules having one or more heat exchangers and one or more power electronics devices.

It is noted that the term "substantially" may be utilized herein to represent the inherent degree of uncertainty that may be attributed to any quantitative comparison, value, measurement, or other representation. This term is also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A heat exchanger fluid distribution manifold comprising: a manifold body, wherein the manifold body defines a coolant fluid chamber; a single fluid inlet for introducing a coolant fluid into the coolant fluid chamber of the manifold body; and a plurality of fluid outlets for removing the coolant fluid from the coolant fluid chamber, wherein at least two of the plurality of fluid outlets are separated from the single fluid inlet by an unequal distance; and a plurality of serpentine walls along a perimeter of the coolant fluid chamber, wherein each serpentine wall comprises a spline feature located proximate to an individual fluid outlet such that a coolant fluid flow rate of the coolant fluid at each fluid outlet is substantially uniform.

2. The heat exchanger fluid distribution manifold of claim 1, wherein the spline features of the plurality of serpentine walls are geometrically optimized such that the coolant fluid flow rate at each fluid outlet is substantially uniform.

3. The heat exchanger fluid distribution manifold of claim 2, wherein a shape of the spline features corresponds with a distance of the fluid outlets from the single fluid inlet and a coolant flow velocity.

4. The heat exchanger fluid distribution manifold of claim 1, wherein the spline features of the plurality of serpentine walls are geometrically optimized such that a total pressure drop within the manifold body is less than about 2 kPa.

5. The heat exchanger fluid distribution manifold of claim 1, further comprising one or more coolant fluid interior routing features located within the coolant fluid chamber for uniformly routing the coolant fluid toward the plurality of fluid outlets.

6. The heat exchanger fluid distribution manifold of claim 1, wherein: the plurality of fluid outlets is uniformly located in a grid-pattern in the coolant fluid chamber; the single fluid inlet is located in a central location with respect to the plurality of fluid outlets; and the heat exchanger fluid distribution manifold further comprises at least four coolant fluid interior routing features radially located within the coolant fluid chamber with respect to the single fluid inlet for uniformly routing the coolant fluid toward the plurality of fluid outlets.

7. The heat exchanger fluid distribution manifold of claim 1, wherein: the single fluid inlet is located at an end of the manifold body; and the plurality of fluid outlets are located within the coolant fluid chamber in at least two rows along a single direction with respect to the single fluid inlet.

8. A heat exchanger fluid distribution manifold comprising: a manifold body, wherein the manifold body defines a coolant fluid chamber; a single fluid inlet for introducing a coolant fluid into the coolant fluid chamber of the manifold body; a plurality of fluid outlets for removing the coolant fluid from the coolant fluid chamber, wherein at least two of the plurality of fluid outlets are separated from the single fluid inlet by an unequal distance, and a coolant fluid flow rate at each fluid outlet is substantially uniform; and a plurality of serpentine walls along a perimeter of the coolant fluid chamber, wherein each serpentine wall comprises a spline feature located proximate to an individual fluid outlet, the spline features being geometrically optimized such that the coolant fluid flow rate at each fluid outlet is substantially uniform and a total pressure drop within the manifold body is less than about 2 kPa.

9. The heat exchanger fluid distribution manifold of claim 8, wherein a shape of the spline features corresponds with a distance of the fluid outlets from the single fluid inlet and a coolant flow velocity field.

10. The heat exchanger fluid distribution manifold of claim 8, further comprising one or more coolant fluid interior routing features located within the coolant fluid chamber for uniformly routing the coolant fluid toward the plurality of fluid outlets.

11. The heat exchanger fluid distribution manifold of claim 8, wherein: the plurality of fluid outlets is uniformly located in a grid-pattern in the coolant fluid chamber; the single fluid inlet is located in a central location with respect to the plurality of fluid outlets; and the heat exchanger fluid distribution manifold further comprises at least four coolant fluid interior routing features radially located within the coolant fluid chamber with respect to the single fluid inlet for uniformly routing the coolant fluid toward the plurality of fluid outlets.

12. The heat exchanger fluid distribution manifold of claim 8, wherein: the single fluid inlet is located at an edge of the manifold body; and the plurality of fluid outlets is located in at least two rows along a single direction with respect to the single fluid inlet.

13. A power electronics module comprising: a heat exchanger fluid distribution manifold comprising: a manifold body, wherein the manifold body defines a coolant fluid chamber; a single fluid inlet for introducing a coolant fluid into the coolant fluid chamber of the manifold body; and a plurality of fluid outlets for removing the coolant fluid from the coolant fluid chamber, wherein at least two of the plurality of fluid outlets are separated from the single fluid inlet by an unequal distance; and a plurality of serpentine walls along a perimeter of the coolant fluid chamber, wherein each serpentine wall comprises a spline feature located proximate to an individual fluid outlet, and the spline features of the plurality of serpentine walls are geometrically optimized such that a coolant fluid flow rate at each fluid outlet is substantially uniform; a heat exchanger module comprising a heat exchanging surface, the heat exchanger module fluidly coupled to at least one fluid outlet of the heat exchanger fluid distribution manifold, wherein coolant fluid flows from the single fluid inlet and into the heat exchanger module through the fluid outlet; and a power electronics device thermally coupled to the heat exchanger module at the heat exchanging surface.

14. The power electronics module of claim 13, wherein: the plurality of fluid outlets is uniformly located in a grid-pattern in the coolant fluid chamber; the single fluid inlet is located in a central location with respect to the plurality of fluid outlets; and the heat exchanger fluid distribution manifold further comprises four coolant fluid interior routing features radially located within the coolant fluid chamber with respect to the single fluid inlet for uniformly routing the coolant fluid toward the plurality of fluid outlets.

15. The power electronics module of claim 13, wherein: the single fluid inlet is located at an edge of the manifold body; and the plurality of fluid outlets is located in at least two rows along a single direction with respect to the single fluid inlet.

16. The power electronics module of claim 13, wherein a total pressure drop within the manifold body is less than about 2 kPa.

17. The power electronics module of claim 16, wherein a shape of the spline features corresponds with a distance of the fluid outlets from the single fluid inlet and a coolant flow velocity field.

18. The power electronics module of claim 13, wherein the heat exchanger fluid distribution manifold further comprises one or more coolant fluid interior routing features located within the coolant fluid chamber for uniformly routing the coolant fluid toward the plurality of fluid outlets.

* * * * *